US008754881B2

(12) United States Patent
Murakami

(10) Patent No.: US 8,754,881 B2
(45) Date of Patent: Jun. 17, 2014

(54) OPERATIONAL AMPLIFIER AND LIQUID CRYSTAL DRIVE DEVICE USING SAME, AS WELL AS PARAMETER SETTING CIRCUIT, SEMICONDUCTOR DEVICE, AND POWER SUPPLY UNIT

(75) Inventor: Kazuhiro Murakami, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 778 days.

(21) Appl. No.: 12/951,827

(22) Filed: Nov. 22, 2010

(65) Prior Publication Data
US 2011/0128277 A1 Jun. 2, 2011

(30) Foreign Application Priority Data

Nov. 27, 2009 (JP) ................ 2009-269838
Jan. 25, 2010 (JP) ................ 2010-012852
Sep. 28, 2010 (JP) ................ 2010-217512

(51) Int. Cl.
G06F 3/038 (2013.01)
G06F 5/00 (2006.01)

(52) U.S. Cl.
USPC ........... 345/211; 345/204; 345/253; 345/255

(58) Field of Classification Search
USPC .................. 345/211, 204; 330/253, 255
See application file for complete search history.

(56) References Cited

U.S. PATENT DOCUMENTS

| 5,144,585 | A | * | 9/1992 | Min et al. ...................... 365/226 |
| 5,670,910 | A | * | 9/1997 | Kato ............................. 330/253 |
| 5,831,480 | A | * | 11/1998 | Kato et al. ..................... 330/253 |
| 5,909,112 | A | * | 6/1999 | Kiyota et al. .................. 323/225 |
| 6,075,345 | A | * | 6/2000 | Lee .............................. 320/138 |
| 6,118,438 | A | * | 9/2000 | Ho .............................. 345/204 |
| 6,496,168 | B1 | * | 12/2002 | Tomida .......................... 345/76 |
| 6,633,287 | B1 | * | 10/2003 | Yatabe et al. ................. 345/211 |
| 7,245,465 | B2 | * | 7/2007 | Hikita ........................... 361/18 |
| 7,457,089 | B2 | * | 11/2008 | Ohshima ........................ 361/86 |
| 7,667,435 | B2 | * | 2/2010 | Denning ........................ 320/132 |
| 7,679,874 | B2 | * | 3/2010 | Barbehenn et al. ............ 361/86 |
| 7,710,076 | B2 | * | 5/2010 | Goto ............................ 320/134 |
| 7,715,160 | B2 | * | 5/2010 | Scheikl et al. ................. 361/86 |
| 7,791,580 | B2 | * | 9/2010 | Chung .......................... 345/98 |
| 7,808,468 | B2 | * | 10/2010 | Son et al. ...................... 345/98 |
| 7,855,536 | B2 | * | 12/2010 | Sumita .......................... 323/275 |
| 7,898,217 | B2 | * | 3/2011 | Nate et al. ..................... 320/134 |
| 8,004,285 | B2 | * | 8/2011 | Endou ........................... 324/522 |

(Continued)

FOREIGN PATENT DOCUMENTS

| EP | 696844 A1 * | 2/1996 | ............... H03F 3/30 |
| JP | 08-056128 | 2/1996 | |
| JP | 2008-187847 | 8/2008 | |

*Primary Examiner* — Alexander S Beck
*Assistant Examiner* — Sejoon Ahn
(74) *Attorney, Agent, or Firm* — Fish & Richardson P.C.

(57) ABSTRACT

The operational amplifier according to the present invention has at least one differential input part for generating a voltage signal corresponding to an electric potential difference between a positive-phase input signal and a negative-phase input signal by using a differential pair configured from a pair of transistors; an output part for generating and outputting an output signal of a logic level corresponding to the voltage signal generated by the differential input part; at least one auxiliary current generator for detecting a sudden change in the positive-phase input signal or the negative-phase input signal and generating an auxiliary current; and a drive current generator for adding together a predetermined reference current and the auxiliary current and generating a drive current of the differential input part.

16 Claims, 11 Drawing Sheets

(56) References Cited

U.S. PATENT DOCUMENTS

| | | | | |
|---|---|---|---|---|
| 8,022,899 B2* | 9/2011 | Takahara | | 345/76 |
| 8,125,432 B2* | 2/2012 | Ito | | 345/95 |
| 8,564,214 B2* | 10/2013 | Briggs | | 315/209 R |
| 8,604,713 B2* | 12/2013 | Briggs | | 315/307 |
| 2002/0067207 A1* | 6/2002 | Kato | | 330/255 |
| 2004/0263504 A1* | 12/2004 | Kato | | 345/204 |
| 2007/0046587 A1* | 3/2007 | Takahara | | 345/76 |
| 2007/0080905 A1* | 4/2007 | Takahara | | 345/76 |
| 2007/0177313 A1* | 8/2007 | Sumita | | 361/18 |
| 2007/0194759 A1* | 8/2007 | Shimizu et al. | | 320/166 |
| 2008/0042958 A1* | 2/2008 | Chung | | 345/94 |
| 2009/0103219 A1* | 4/2009 | Tamegai | | 361/86 |
| 2009/0108822 A1* | 4/2009 | Hoshino et al. | | 323/274 |
| 2009/0116158 A1* | 5/2009 | Graves et al. | | 361/86 |
| 2009/0134860 A1* | 5/2009 | Umemoto et al. | | 323/282 |
| 2009/0231319 A1* | 9/2009 | Tsuchi | | 345/211 |
| 2009/0259418 A1* | 10/2009 | Yokomizo et al. | | 702/63 |
| 2009/0273237 A1* | 11/2009 | Inoue | | 307/10.1 |
| 2009/0289612 A1* | 11/2009 | Hojo et al. | | 323/290 |
| 2010/0073836 A1* | 3/2010 | Arnold | | 361/86 |
| 2010/0123812 A1* | 5/2010 | Sekiguchi et al. | | 348/308 |
| 2010/0128018 A1* | 5/2010 | Nakayama | | 345/212 |
| 2010/0321844 A1* | 12/2010 | Landwehr | | 361/86 |
| 2010/0328295 A1* | 12/2010 | Piasecki et al. | | 345/212 |
| 2011/0032240 A1* | 2/2011 | Wang et al. | | 345/212 |
| 2011/0141098 A1* | 6/2011 | Yaguma et al. | | 345/212 |
| 2012/0032932 A1* | 2/2012 | Kojima | | 345/204 |
| 2012/0127138 A1* | 5/2012 | Tsuchi | | 345/204 |
| 2012/0133632 A1* | 5/2012 | Hsu | | 345/211 |

* cited by examiner

FIG. 9

| | ABNORMAL STATE | SS | AVDD&LX | LDO | RESTART CONDITIONS |
|---|---|---|---|---|---|
| ENA Low | ENA<LDOOx0.3 | DISCHARGE | OFF | ACTIVE | |
| ENA High | ENA>LDOOx0.7 | CHARGE | ACTIVE | ACTIVE | |
| UVLO | VIN<1.8V | DISCHARGE | OFF | OFF | ABNORMAL STATE RESOLVED |
| TOP | Tj>150°C | DISCHARGE | OFF | OFF | POWER SUPPLY RESTART |
| OVP | AVDD>15V | DISCHARGE | OFF | ACTIVE | ABNORMAL STATE RESOLVED |
| OCP | LX OVER CURRENT | DISCHARGE | OFF | ACTIVE | ABNORMAL STATE RESOLVED |

OPERATIONAL AMPLIFIER AND LIQUID CRYSTAL DRIVE DEVICE USING SAME, AS WELL AS PARAMETER SETTING CIRCUIT, SEMICONDUCTOR DEVICE, AND POWER SUPPLY UNIT

CROSS-REFERENCE TO RELATED APPLICATIONS

This application is based on the following Japanese patent applications, the contents of which are hereby incorporated by reference.

(1) Japanese Patent Application No. 2009-269838 (filed on Nov. 27, 2009)

(2) Japanese Patent Application No. 2010-012852 (filed on Jan. 25, 2010)

(3) Japanese Patent Application No. 2010-217512 (filed on Sep. 28, 2010)

BACKGROUND OF THE INVENTION

1. Field of the Invention
<First Technical Field>

The first technical feature disclosed in the present specification relates to a technique for increasing the slew rate of an operational amplifier.

<Second Technical Field>

The second technical feature disclosed in the present specification relates to a parameter setting and generating circuit, and a semiconductor device and a power supply unit incorporating the parameter setting and generating circuit.

2. Description of Related Art
<First Technical Background>

FIG. 5 is a schematic view showing a conventional example of an operational amplifier. In the conventional operational amplifier, a sudden change in a positive-phase input signal impressed on a positive-phase input terminal INP causes the operational amplifier to attempt to output an output signal that follows the input variation. The operational amplifier is required to deliver a rapid response performance (slew rate) during this process. Conventionally, it has been necessary to make the drive current Id of the operational amplifier more powerful and to drive the gate of the metal oxide semiconductor (MOS) field effect transistor that forms the output part of the operational amplifier at a higher rate in order to increase the slew rate of the operational amplifier.

Japanese Laid-open Patent Application No. 8-56128 can be given as one example of the prior art with relation to the above.

<Second Technical Background>

FIG. 10 is a circuit diagram showing a conventional example of an overcurrent protection circuit. The conventional overcurrent protection circuit shown in FIG. 10 is configured so as to be built into a semiconductor device 300 (DC/DC controller IC) that functions as part of a step-down switching regulator operating in synchronous rectification mode, to compare a predetermined threshold voltage Vth and a pulsed switch voltage Vsw (more accurately, a second switch voltage Vsw2 obtained by extracting only a low-level electric potential of the switch voltage Vsw obtained during the on-state of the transistor N2) brought out from the drain of an external transistor N2 mounted on the semiconductor device 300, and to generate an overcurrent protection signal OCP.

Japanese Laid-open Patent Application No. 2008-187847 filed by the present applicant can be given as one example of the prior art with relation to the above.

SUMMARY OF THE INVENTION

<First Problem>

However, when the drive current Id of the operational amplifier is increased in order to increase the slew rate of the operational amplifier, a problem is presented in that the current normally consumed by the operational amplifier increases dramatically. For example, in order to increase the slew rate of the operational amplifier from 5 V/µs to 50 V/µs, the drive current Id of the operational amplifier must be increased from 0.5 mA to 50 mA, making it impossible to obtain a practical means of solving the problem.

When the drive current Id of the operational amplifier is increased in order to increase the slew rate of the operational amplifier, the gain of the operational amplifier also unintentionally rises at the same time, for which reason a problem is also presented in that the stability (phase margin) of the operational amplifier cannot be ensured.

<Second Problem>

However, as shown in FIG. 10, a threshold voltage generation circuit for generating a predetermined threshold voltage Vth is generally configured to generate a desired threshold voltage Vx (equal to Ix×Rx) by passing a predetermined constant current Ix through an external resistor Rx mounted on an external terminal Tx. In other words, the external terminal Tx must be provided to the semiconductor device 300 for the sole purpose of mounting the resistor Rx for setting the threshold voltage, and is a factor that impedes creating a smaller package.

<First Object>

In light of the first problem discussed above, it is an object of the present invention to provide an operational amplifier that can be endowed with a higher slew rate without increasing the normally supplied drive current, and to provide a liquid crystal drive device using the operational amplifier.

<Second Object>

In light of the second problem discussed above, it is an object of the present invention to provide a parameter setting circuit that allows the threshold voltage and other parameters to be arbitrarily set without needlessly increasing the number of external terminals of the semiconductor device, and to provide a semiconductor device and a power supply unit having the parameter setting circuit.

<First Technical Feature>

In order to attain the abovementioned first object, the operational amplifier according to the present invention is configured (configuration 1-1) so as to have at least one differential input part for generating a voltage signal corresponding to an electric potential difference between a positive-phase input signal and a negative-phase input signal by using a differential pair configured from a pair of transistors, an output part for generating and outputting an output signal of a logic level corresponding to the voltage signal generated by the differential input part, at least one auxiliary current generator for detecting a sudden change in the positive-phase input signal or the negative-phase input signal and generating an auxiliary current, and a drive current generator for adding together a predetermined reference current and the auxiliary current and generating a drive current of the differential input part.

With the operational amplifier having the above-described configuration 1-1, the auxiliary current generator may be configured (configuration 1-2) so as to have a differentiating circuit for receiving an input of a voltage that appears in a common connection end of the differential pair, and generating a differential waveform signal thereof; and a switch for controlling generation or non-generation of the auxiliary current in accordance with the differential waveform signal.

In the operational amplifier having the above-described configuration 1-2, the differentiating circuit may be configured (configuration 1-3) as a CR filter having a resistor and a capacitor.

The operational amplifier having any of the above-described configurations 1-1 to 1-3 may be configured (configuration 1-4) so as to have, as the differential input part, a first differential input part having a first differential pair configured from a pair of p-channel MOS field effect transistors, and a second differential input part having a second differential pair configured from a pair of n-channel MOS field effect transistors.

The operational amplifier having the above-described configuration 1-4 may be configured (configuration 1-5) so as to have, as the auxiliary current generator, a first auxiliary current generator for monitoring a first voltage that appears in a common connection end of the first differential pair, detecting a fall from a high level to a low level in the positive-phase input signal, and generating a first auxiliary current; and a second auxiliary current generator for monitoring a second voltage that appears in a common connection end of the second differential pair, detecting a rise from a low level to a high level in the positive-phase input signal, and generating a second auxiliary current.

The liquid crystal drive device according to the present invention is configured (configuration 1-6) using the operational amplifier having any of the above-described configurations 1-1 to 1-5 as a unit gain amplifier provided in a signal path to a liquid crystal display panel.

<Second Technical Feature>

In order to attain the abovementioned second object, the parameter setting circuit according to the present invention is configured (configuration 2-1) so as to be integrated in a semiconductor device having a first external terminal impressed with a fixed voltage, and a second external terminal connected to the first external terminal via an external resistor; and to pass a current through the external resistor by impressing a predetermined reference voltage between the first external terminal and the second external terminal, and to set an internal parameter for the semiconductor device in accordance with the current.

The parameter setting circuit having the above-described configuration 2-1 may be configured (configuration 2-2) so as to have a transistor having one end connected to the second external terminal; a resistor having one end connected to another end of the transistor; and an operational amplifier having a first input end connected to the first external terminal via a voltage source for generating the reference voltage, having a second input end connected to the second external terminal, and having an output end connected to a control end of the transistor; wherein a voltage signal brought out from one end of the resistor is output as the internal parameter.

In the parameter setting circuit having the above-described configuration 2-1 or 2-2, the second external terminal may be configured (configuration 2-3) as an input terminal, an output terminal, or an input/output terminal for a logic signal.

With the parameter setting circuit having the above-described configuration 2-3, the logic signal may be configured (configuration 2-4) as an enable signal for controlling the operation or non-operation of the semiconductor device.

The semi-conductor device according to the present invention is configured (configuration 2-5) so as to have an overcurrent protection circuit for comparing a predetermined threshold voltage and a detected voltage whose voltage value varies in accordance with a magnitude of a monitored current, and generating an overcurrent protection signal; and to have a parameter setting circuit having any of the above-described configurations 2-1 to 2-4 for outputting the internal parameter as the threshold voltage.

The semiconductor device having the above-described configuration 2-5 may be configured (configuration 2-6) so as to have a switch drive circuit provided with a shut-down function based on the overcurrent protection signal.

The power supply unit according to the present invention is configured (configuration 2-7) so as to have a semiconductor device having the above-described configuration 2-6, and to have a switching element subjected to on/off control by the switch drive circuit; wherein a desired output voltage is generated from an input voltage.

<Combination of First and Second Technical Features>

The liquid crystal drive device according to the present invention is configured (configuration 3-1) as a liquid crystal drive device having, integrated in a semiconductor device, a unit gain amplifier provided in a signal path to a liquid crystal display panel, and a power supply circuit for generating a desired output voltage from an input voltage and supplying electrical power to the unit gain amplifier; wherein the unit gain amplifier has at least one differential input part for generating a voltage signal corresponding to an electric potential difference between a positive-phase input signal and a negative-phase input signal by using a differential pair configured from a pair of transistors, an output part for generating and outputting an output signal of a logic level corresponding to the voltage signal generated by the differential input part, at least one auxiliary current generator for detecting a sudden change in the positive-phase input signal or the negative-phase input signal and generating an auxiliary current, and a drive current generator for adding together a predetermined reference current and the auxiliary current and generating a drive current of the differential input part; wherein the semiconductor device has a first external terminal impressed with a fixed voltage, and a second external terminal connected to the first external terminal via an external resistor; and wherein the power supply circuit has an overcurrent protection circuit for generating an overcurrent protection signal showing whether a monitored current is in an overcurrent state, and an overcurrent protection value setting circuit for passing a current through the external resistor by impressing a predetermined reference voltage between the first external terminal and the second external terminal, and setting an overcurrent protection value for the overcurrent protection circuit in accordance with the current.

In the liquid crystal drive device having the above-described configuration 3-1, the auxiliary current generator may be configured (configuration 3-2) so as to have a differentiating circuit for receiving an input of a voltage that appears in a common connection end of the differential pair and generating a differential waveform signal thereof, and a switch for controlling generation or non-generation of the auxiliary current in accordance with the differential waveform signal.

In the liquid crystal drive device having the above-described configuration 3-2, the differential circuit may be configured (configuration 3-3) as a CR filter having a resistor and a capacitor.

The liquid crystal drive device having any of the above-described configurations 3-1 to 3-3 may be configured (configuration 3-4) so as to have, as the differential input part, a first differential input part having a first differential pair configured from a pair of p-channel MOS field effect transistors, and a second differential input part having a second differential pair configured from a pair of n-channel MOS field effect transistors.

The liquid crystal drive device having the above-described configuration 3-4 may be configured (configuration 3-5) so as to have, as the auxiliary current generator, a first auxiliary current generator for monitoring a first voltage that appears in a common connection end of the first differential pair, detecting a fall from a high level to a low level in the positive-phase input signal, and generating a first auxiliary current; and a second auxiliary current generator for monitoring a second voltage that appears in a common connection end of the second differential pair, detecting a rise from a low level to a high level in the positive-phase input signal, and generating a second auxiliary current.

In the liquid crystal drive device having any of the above-described configurations 3-1 to 3-5, the overcurrent protection value setting circuit may be configured (configuration 3-6) so as to have a transistor having one end connected to the second external terminal; a resistor having one end connected to another end of the transistor; and an operational amplifier having a first input end connected to the first external terminal via a voltage source for generating the reference voltage, having a second input end connected to the second external terminal, and having an output end connected to a control end of the transistor; wherein a voltage signal brought out from one end of the resistor is output as the overcurrent protection value.

In the liquid crystal drive device having any of the above-described configurations 3-1 to 3-6, the second external terminal may be configured (configuration 3-7) as an input terminal, output terminal, or input/output terminal of the logic signal.

In the liquid crystal drive device having the above-described configuration 3-7, the logic signal may be configured (configuration 3-8) as an enable signal for controlling the operation or non-operation of the semiconductor device.

In the liquid crystal drive device having any of the above-described configurations 3-1 to 3-8, the power supply circuit may be configured (configuration 3-9) so as to have a switch drive circuit provided with a shut-down function based on the overcurrent protection signal.

The liquid crystal drive device having the above-described configuration 3-9 may be configured (configuration 3-10) so as to have a switching element subjected to on/off control by the switch drive circuit.

<First Effect>
With the operational amplifier according to the present invention, the slew rate can be increased without increasing the normally supplied drive current.

<Second Effect>
With the parameter setting circuit according to the present invention, the threshold voltage and other parameters can be arbitrarily set without needlessly increasing the number of external terminals of the semiconductor device.

Other features, elements, steps, benefits, and characteristics of the present invention will become more apparent from the subsequent detailed description of the preferred embodiments, and the appended drawings related thereto.

BRIEF DESCRIPTION OF THE DRAWINGS

FIG. 9 is a reference chart illustrating a reset operation in general terms;

DETAILED DESCRIPTION OF PREFERRED EMBODIMENTS

<Description of the First Technical Feature (Operational Amplifier)>

Figure 1:
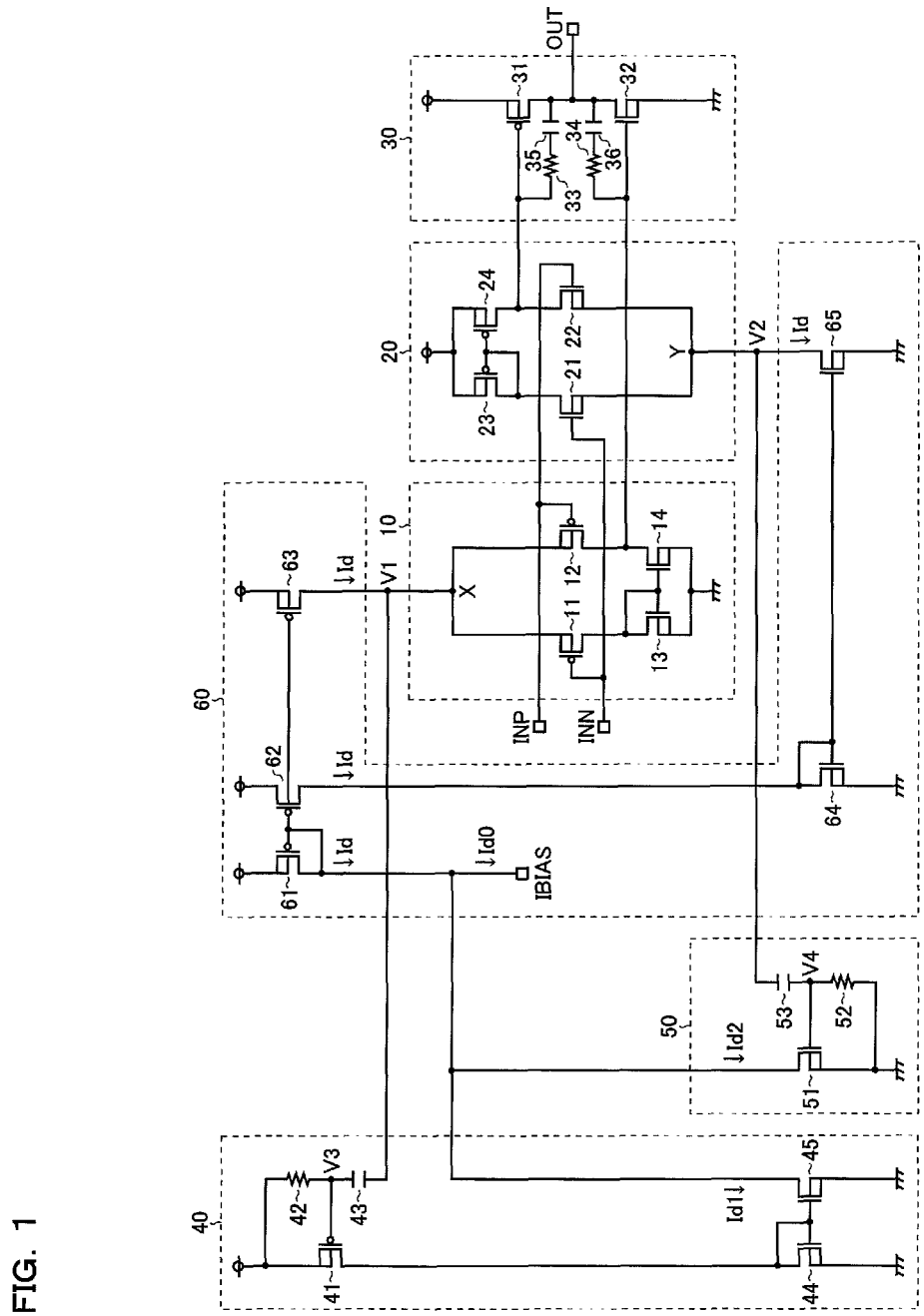
FIG. 1 is a circuit diagram showing the first embodiment of an operational amplifier according to the present invention.

FIG. 1 is a circuit diagram showing a first embodiment of an operational amplifier according to the present invention. The operational amplifier of the present embodiment has a first differential input part 10, a second differential input part 20, an output part 30, a first auxiliary current generator 40, a second auxiliary current generator 50, and a drive current generator 60.

The first differential input part 10 is a circuit block for receiving both a positive-phase input signal impressed on a positive-phase input terminal INP and a negative-phase input signal impressed on a negative-phase terminal INN, and generating a first voltage signal that corresponds to the electric potential difference between the two input signals by using a first differential pair configured from a pair of p-channel MOS field effect transistors. The first differential input part 10 has p-channel MOS field effect transistors 11, 12, and n-channel MOS field effect transistors 13, 14.

The second differential input part 20 is a circuit block for receiving both the positive-phase input signal impressed on the positive-phase input terminal INP, and the negative-phase input signal impressed on the negative-phase terminal INN, and generating a second voltage signal that corresponds to the electric potential difference between the two input signals by using a second differential pair configured from a pair of n-channel MOS field effect transistors. The second differential input part 20 has n-channel MOS field effect transistors 21, 22, and p-channel MOS field effect transistors 23, 24.

The output part 30 is a circuit block for generating an output signal of a logic level that corresponds to the first and second voltage signals generated by the first differential input part 10 and the second differential input part 20, respectively, and for outputting the logic-level output signal from an output terminal OUT. The output part 30 has a p-channel MOS field effect transistor 31, an n-channel MOS field effect transistor 32, resistors 33, 34, and capacitors 35, 36.

The first auxiliary current generator 40 is a block circuit for monitoring a first voltage V1 appearing in a common connection end X (the input end of a drive current Id) of the first differential pair, detecting a sudden fall from a high level to a low level in the positive-phase input signal impressed on the positive-phase input terminal INP, and generating a first auxiliary current Id1. The first auxiliary current generator 40 has a p-channel MOS field effect transistor 41, a resistor 42, a capacitor 43, and n-channel MOS field effect transistors 44, 45.

The second auxiliary current generator 50 is a circuit block for monitoring a second voltage V2 appearing in a common connection end Y (the input end of the drive current Id) of the second differential pair, detecting a sudden rise from a low level to a high level in the positive-phase input signal impressed on the positive-phase input terminal INP, and generating a second auxiliary current Id2. The second auxiliary current generator 50 has an n-channel MOS field effect transistor 51, a resistor 52, and a capacitor 53.

The drive current generator 60 is a circuit block for generating a drive current Id of the first differential input part 10 and the second differential input part 20 by adding together a predetermined reference current Id0 (corresponding to a requisite minimum drive current Id in the static state of the operational amplifier (an operating state in which no sudden change in the input signal is generated)), and the first auxiliary current Id1 or second auxiliary current Id2. The drive current generator 60 has p-channel MOS field effect transistors 61 to 63, and n-channel MOS field effect transistors 64, 65.

Next, the connective relationship between the above-described elements will be described in detail. The gate of the transistor 11 is connected to the negative-phase input terminal INN, and the gate of the transistor 12 is connected to the positive-phase input terminal INP. The source and the back gate of the transistor 11, and the source and the back gate of the transistor 12 are mutually connected, and the connection node thereof corresponds to the common connection end X of the first differential pair. The drain of the transistor 11 is connected to the drain of the transistor 13, and the drain of the transistor 12 is connected to the drain of the transistor 14. The gate of the transistor 13 and the gate of the transistor 14 are each connected to the drain of the transistor 13. The source and the back gate of the transistor 13 and the source and the back gate of the transistor 14 are each connected to a ground end.

The gate of the transistor 21 is connected to the negative-phase input terminal INN, and the gate of the transistor 22 is connected to the positive-phase input terminal INP. The source and the back gate of the transistor 21, and the source and the back gate of the transistor 22 are mutually connected, and the connection node thereof corresponds to the common connection end Y of the second differential pair. The drain of the transistor 21 is connected to the drain of the transistor 23, and the drain of the transistor 22 is connected to the drain of the transistor 24. The gate of the transistor 23 and the gate of the transistor 24 are each connected to the drain of the transistor 23. The source and the back gate of the transistor 23, and the source and the back gate of the transistor 24 are each connected to a power supply end.

The gate of the transistor 31 is connected to the connection node of the drain of the transistor 22 and the drain of the transistor 24. The source and the back gate of the transistor 31 are each connected to the power supply end. The drain of the transistor 31 is connected to the output terminal OUT. The resistor 33 and the capacitor 35 are serially connected between the gate and the drain of the transistor 31. The gate of the transistor 32 is connected to the connection node of the drain of the transistor 12 and the drain of the transistor 14. The source and the back gate of the transistor 32 are each connected to the ground end. The drain of the transistor 32 is connected to the output terminal OUT. The resistor 34 and the capacitor 36 are serially connected between the gate and the drain of the transistor 32.

The source and the back gate of the transistor 41 are each connected to the power supply end. The resistor 42 is connected between the gate and the source of the transistor 41. The capacitor 43 is connected between the gate of the transistor 41 and the common connection end X of the first differential pair. The drain of the transistor 41 is connected to a drain of the transistor 44. The gate of the transistor 44 and the gate of the transistor 45 are each connected to the drain of the transistor 44. The source and the back gate of the transistor 44, and the source and the back gate of the transistor 45 are each connected to the ground end. The drain of the transistor 45 is connected to a current bias terminal IBIAS.

The source and the back gate of the transistor 51 are each connected to the ground end. The resistor 52 is connected between the gate and the source of the transistor 51. The capacitor 53 is connected between the gate of the transistor 51 and the common connection end Y of the second differential pair. The drain of the transistor 51 is connected to the current bias terminal IBIAS.

The sources and the back gates of the transistors 61 to 63 are each connected to the power supply end. The gates of the transistors 61 to 63 are each connected to the drain of the transistor 61. The drain of the transistor 61 is connected to the current bias terminal IBIAS. The drain of the transistor 62 is connected to the drain of the transistor 64. The drain of the transistor 63 is connected to the common connection end X of the first differential pair. The gate of the transistor 64 and the gate of the transistor 65 are each connected to the drain of the transistor 64. The source and the back gate of the transistor 64, and the source and the back gate of the transistor 65 are each connected to the ground end. The drain of the transistor 65 is connected to the common connection end Y of the second differential pair.

Next, the basic operation of the operational amplifier having the above configuration will be described. A first voltage signal output from the first differential input part 10 to the gate of the transistor 32 decreases, as does a second voltage signal output from the second differential input part 20 to the gate of the transistor 31, in a case where the voltage level of the positive-phase input signal impressed on the positive-phase input terminal INP is higher than the voltage level of the negative-phase input signal impressed on the negative-phase input terminal INN. A current accordingly flows to the output terminal OUT from the power supply end via the transistor 31, and the voltage level of the output signal therefore increases. Conversely, the first voltage signal output from the first differential input part 10 to the gate of the transistor 32 increases, as does the second voltage signal output from the second differential input part 20 to the gate of the transistor 31, in a case where the voltage level of the positive-phase input signal impressed on the positive-phase input terminal INP is lower than the voltage level of the negative-phase input signal impressed on the negative-phase input terminal INN. A current accordingly flows to the ground end from the output terminal OUT via the transistor 32, and the voltage level of the output signal therefore decreases. An output signal that corresponds to the electric potential difference between the positive-phase input signal and the negative-phase input signal is thus generated by the operational amplifier having the above-described configuration.

The auxiliary current generating operation (slew rate accelerating operation) of the operational amplifier having the above-described configuration will be described next.

When the positive-phase input signal impressed on the positive-phase input terminal INP falls from a high level to a low level, the first voltage V1 appearing in the common connection end X of the first differential pair similarly falls from a high level to a low level as well. Here, the resistor 42 and the capacitor 43 of the first auxiliary current generator 40 function as a differentiating circuit (CR filter) for receiving the input of the first voltage V1 and generating a differential waveform signal V3 thereof. In other words, at the point when the first voltage V1 has fallen from a high level to a low level, the differential waveform signal V3, which up to that point had been maintained at the voltage level of the power supply end, decreases abruptly, and an electric potential difference is generated between the gate and source of the transistor 41. As a result, the transistor 41 is turned on, and the first auxiliary current Id1 flows from the power supply end through a current pathway via the transistor 41. In other words, the transistor 41 functions as a switch for controlling whether the first auxiliary current Id1 is generated in accordance with the differential waveform signal V3. The first auxiliary current Id1 thus generated is converted to a current of the same direction as the reference current Id0 by a current mirror circuit using the transistors 44 and 45, is then ultimately added to the reference current Id0, and becomes the drive current Id (equal to Id0+Id1) of the first differential input part 10 and the second differential input part 20.

Conversely, when the positive-phase input signal impressed on the positive-phase input terminal INP rises from a low level to a high level, the second voltage V2 appearing in the common connection end Y of the second differential pair similarly rises from a low level to a high level as well. Here, the resistor 52 and the capacitor 53 of the second auxiliary current generator 50 function as a differentiating circuit (CR filter) for receiving the input of the second voltage V2 and generating a differential waveform signal V4 thereof. In other words, at the point when the second voltage V2 has risen from a low level to a high level, the differential waveform signal V4, which up to that point had been maintained at the voltage level of the ground end, increases abruptly, and an electric potential difference is generated between the gate and source of the transistor 51. As a result, the transistor 51 is turned on, and the second auxiliary current Id2 flows toward the ground end through a current pathway via the transistor 51. In other words, the transistor 51 functions as a switch for controlling whether the second auxiliary current Id2 is generated in accordance with the differential waveform signal V4. The second auxiliary current Id2 thus generated is ultimately added to the reference current Id0 and becomes the drive current Id (equal to Id0+Id2) of the first differential input part 10 and the second differential input part 20.

Through this type of auxiliary current generating operation, the slew rate can be increased without causing an increase in the regular drive current Id of the operational amplifier because the drive current Id of the operational amplifier is restricted to the requisite minimum reference current Id0 when no sudden change in the positive-phase input signal or the negative-phase input signal is generated, and because the drive current Id of the operational amplifier can be caused to increase in a supplementary manner only when there is a sudden change (pulse edge) in the positive-phase input signal or the negative-phase input signal. In addition, there is no steady increase in the drive current Id of the operational amplifier at the time that the slew rate of the operational amplifier accelerates, making it possible to readily ensure the stability (phase margin) of the operational amplifier without an unintended increase in the gain of the operational amplifier.

The operational amplifier of the first embodiment is provided with the first auxiliary current generator 40 for monitoring the first voltage V1 that appears in the common connection end X of the first differential pair and generating the first auxiliary current Id1, and the second auxiliary current generator 50 for monitoring the second voltage V2 that appears in the common connection end Y of the second differential pair and generating the second auxiliary current Id2. The slew rate of the operational amplifier can therefore be increased appropriately even when a fall from a high level to a low level or, conversely, a rise from a low level to a high level is generated as the sudden change in the positive-phase input signal or the negative-phase input signal.

When the positive-phase input signal impressed on the positive-phase input terminal INP falls from a high level to a low level, the second voltage V2 appearing in the common connection end Y of the second differential pair similarly falls from a high level to a low level, and the differential waveform signal V4 therefore instantaneously decreases below the voltage level of the ground end. However, the transistor 51 is not turned on by such a differential waveform signal V4, and therefore the second auxiliary current Id2 is not generated. Similarly, when the positive-phase input signal impressed on the positive-phase input terminal INP rises from a low level to a high level, the first voltage V1 appearing in the common connection end X of the first differential pair also rises from a low level to a high level in the same manner, and the differential waveform signal V3 therefore instantaneously increases above the voltage level of the power supply end. However, the transistor 41 is not turned on by such a differential waveform signal V3, and therefore the first auxiliary current Id1 is not generated. In other words, with the operational amplifier of the first embodiment, the first auxiliary current Id1 and the second auxiliary current Id2 are generated simultaneously, and no defects arise in the form of an unnecessary increase in the drive current Id of the operational amplifier.

Figure 2:
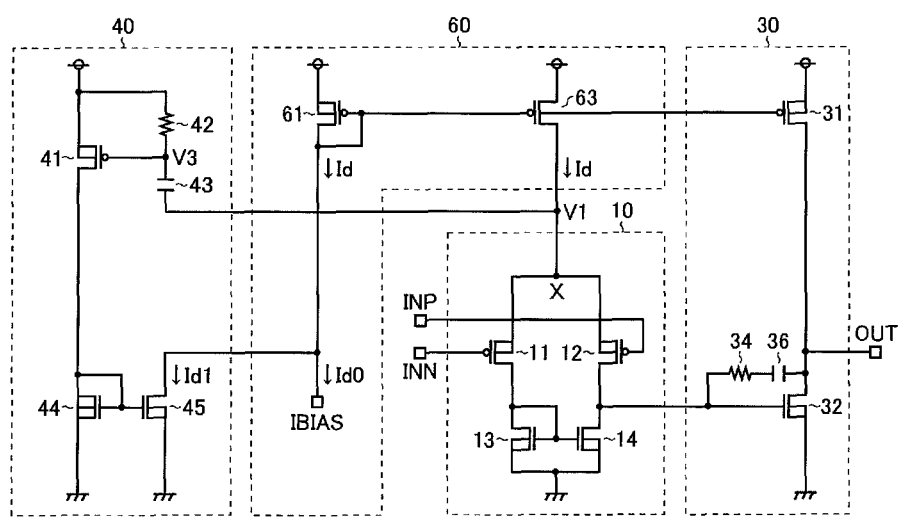
FIG. 2 is a circuit diagram showing the second embodiment of the operational amplifier according to the present invention.

FIG. 2 is a circuit diagram showing a second embodiment of the operational amplifier according to the present invention. The operational amplifier of the present embodiment is configured having only the first differential input part 10 as the differential input part thereof. Differences with the first embodiment may include the absence of the second differential input part 20 and the second auxiliary current generator 50, the absence of the transistors 62, 64, 65 in the drive current generator 60, and the absence of the resistor 33 and the capacitor 35 in the output part 30, as well as the fact that the gate of the transistor 31 is connected to the gates of the transistors 61, 63. The present invention is thus also capable of being suitably applied to an operational amplifier having only the first differential input part 10. However, when the present structure is employed, the slew rate of the operational amplifier is increased only when a fall from a high level to a low level is generated as the sudden change in the positive-phase input signal or the negative-phase input signal.

Figure 3:
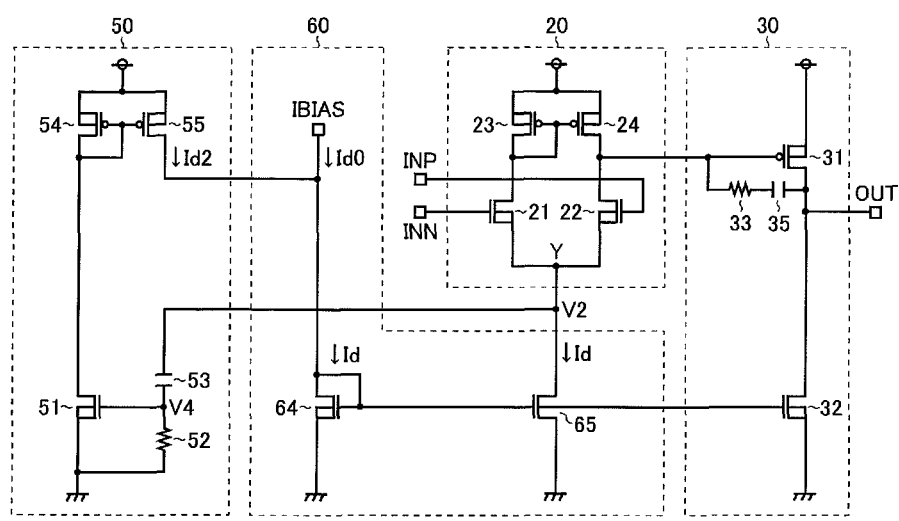
FIG. 3 is a circuit diagram showing the third embodiment of the operational amplifier according to the present invention.

FIG. 3 is a circuit diagram showing a third embodiment of the operational amplifier according to the present invention. The operational amplifier of the present embodiment is configured having only the second differential input part 20 as the differential input part thereof. Differences with the first embodiment may include the absence of the first differential input part 10 and the first auxiliary current generator 40, the absence of the transistors 61 to 63 in the drive current generator 60, the fact that the reference current Id0 is inputted directly to the drain of the transistor 64, the fact that current mirror circuits (transistors 54, 55) for converting the second auxiliary current Id2 to a current having the same direction as the reference current Id0 are added inside the second auxiliary current generator 50, and the absence of the resistor 34 and the capacitor 36 in the output part 30, as well as the fact that the gate of the transistor 32 is connected to the gates of the transistors 64, 65. The present invention can thus be suitably applied to an operational amplifier having only the second differential input part 20. However, when the present structure is employed, the slew rate of the operational amplifier is increased only when a rise from a low level to a high level is generated as the sudden change in the positive-phase input signal or the negative-phase input signal.

Figure 4:
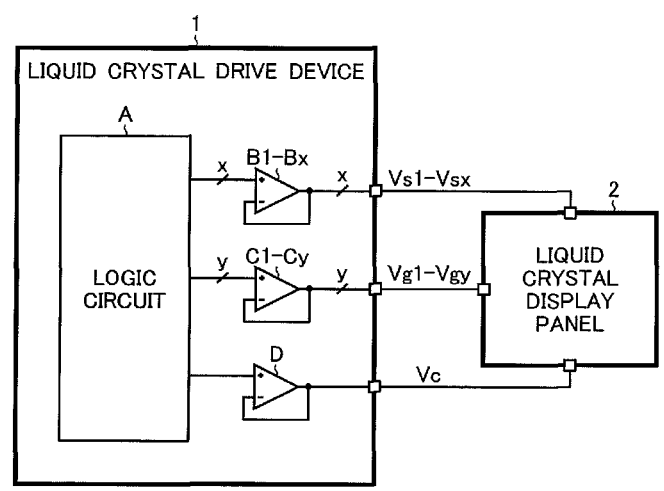
FIG. 4 is a block diagram showing one configurational example of a liquid crystal drive device obtained using the operational amplifier according to the present invention.
Figure 5:
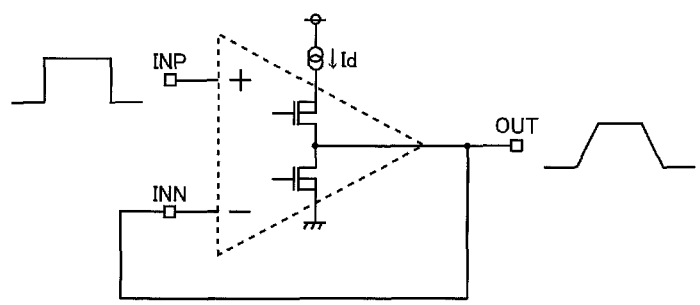
FIG. 5 is a schematic view showing a conventional example of an operational amplifier.

FIG. 4 is a block diagram showing one configurational example of a liquid crystal drive device obtained using the operational amplifier according to the present invention. The liquid crystal drive device 1 of the present example is a semiconductor device for performing the drive control of a liquid crystal display panel 2 by supplying x-system source voltages Vs1 to Vsx, y-system gate voltages Vg1 to Vgy, and a single-system common voltage Vc to the liquid crystal display panel 2, and has a logic circuit A, x-system unit gain amplifiers B1 to Bx, y-system unit gain amplifiers C1 to Cy, and a single-system unit gain amplifier D.

The logic circuit A performs the panel control (tone control in response to a video signal, logical inversion control with each frame and each dot, and the like) of the source voltages Vs1 to Vsx, the gate voltages Vg0 to Vgy, and the common voltage Vc.

The unit gain amplifiers B1 to Bx are correspondingly provided in x-system source signal paths connected to the liquid crystal display panel 2, and the amplifiers output source voltages Vs1 to Vsx corresponding to the input signals from the logic circuit A.

The unit gain amplifiers C1 to Cy are correspondingly provided in y-system gate signal paths connected to the liquid crystal display panel 2, and the amplifiers output gate voltages Vg1 to Vgy corresponding to the input signals from the logic circuit A.

The unit gain amplifier D is provided in a single-system common signal path connected to the liquid crystal display panel 2, and the amplifier outputs the common voltage Vc corresponding to an input signal from the logic circuit A.

If the operational amplifier according to the present invention is employed as the above-described unit gain amplifiers B1 to Bx, unit gain amplifiers C1 to Cy, and unit gain amplifier D, the slew rates of the source voltages Vs1 to Vsx, gate voltages Vg1 to Vgy, and common voltage Vc can be increased without increasing the current consumed by the liquid crystal drive device 1. It is therefore possible to improve the display performance of the liquid crystal display panel 2.

A configuration in which the operational amplifier according to the present invention is employed as the unit gain amplifiers B1 to Bx, unit gain amplifiers C1 to Cy, and the unit gain amplifier D used in the liquid crystal display panel 2 has been described as an example with reference to FIG. 4, but the application objects of the present invention are not limited to this configuration alone, and wide application in operational amplifiers for other purposes is possible.

<Second Technical Feature (Parameter Setting Circuit)>

A detailed description is given below with reference to a configuration in which a parameter setting circuit according to the present invention is applied as a threshold voltage generation circuit for arbitrarily setting an overcurrent protection value (threshold voltage Vth) of an overcurrent protection circuit, the threshold voltage generation circuit being built into a DC/DC controller IC that forms a step-up switching regulator.

Figure 6:
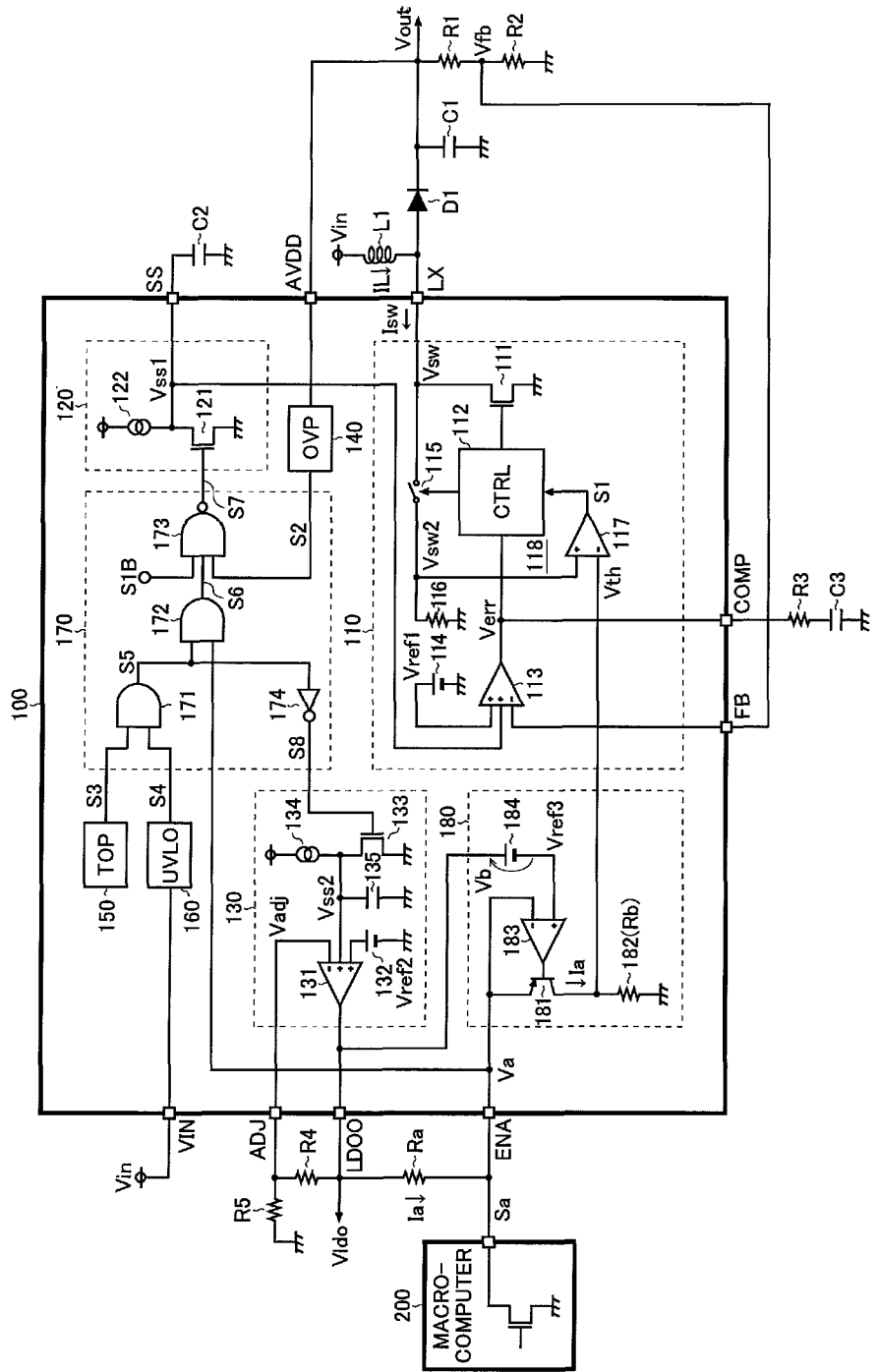
FIG. 6 is a circuit diagram showing one embodiment of a power supply unit provided with a threshold voltage generation circuit according to the present invention.

FIG. 6 is a circuit diagram showing one embodiment of a power supply unit provided with a threshold voltage generation circuit according to the present invention. The power supply unit of the present embodiment has, in addition to a semiconductor device 100, also an inductor L1, diode D1, capacitors C1 to C3, resistors R1 to R5, and resistor Ra as discrete external elements mounted on the semiconductor device 100, and steps down an input voltage Vin to generate a desired output voltage Vout.

The semiconductor 100 has, as a circuit block integrated therein, a switch drive circuit 110, a soft start circuit 120, a low dropout (LDO) regulator circuit 130, an overvoltage protection circuit 140 (referred to below as the "OVP circuit 140"), a thermal overload protection circuit 150 (referred to below as the "TOP circuit 150"), an under-voltage lock-out circuit 160 (referred to below as the "UVLO circuit 160"), a reset circuit 170, and a threshold voltage generation circuit 180.

The semiconductor device 100 has, as means for forming electrical connections with the exterior, a power supply terminal YIN, an LDO feedback input terminal ADJ, an LDO output terminal LDOO, an enable terminal ENA, a feedback input terminal FB, a phase compensation terminal COMP, an inductor connection terminal LX, an analog power supply terminal AVDD, and a soft-start adjustment terminal SS.

One end of an inductor LI is connected to the input end of the input voltage Vin outside of the semiconductor device 100. The other end of the inductor L1 is connected to the inductor connection terminal LX. The anode of the diode D1 is connected to the inductor connection terminal LX. The cathode of the diode D1, one end of the capacitor C1, one end of the resistor R1, and the analog power supply terminal AVDD are each connected to the output end of the output voltage Vout. The other end of the capacitor C1 is connected to the ground end. The other end of the resistor R1 is connected to one end of the resistor R2. The other end of the resistor R2 is connected to the ground end. The soft-start adjustment terminal SS is connected to the ground end via the capacitor C2. The feedback input terminal FB is connected to the connection node between the resistors R1 and R2. The phase compensation terminal COMP is connected to the ground end via the resistor R3 and the capacitor C3. The power supply terminal VIN is connected to the input end of the input voltage Vin. The LDO feedback input terminal ADJ is connected to the LDO output terminal LDOO via the resistor R4, and is also connected to the ground end via the resistor R5. One end of the resistor Ra is connected to the LDO output terminal LDOO. The other end of the resistor Ra is connected to the enable terminal ENA. The enable terminal ENA is an external terminal to which an enable signal Sa for controlling whether to drive the semiconductor device 100 is input from a microcomputer 200, and is connected to an enable signal output terminal (the drain or collector of a transistor for outputting an enable signal) of the microcomputer 200.

Among the above-described discrete elements, the inductor L1, the diode D1, and the capacitor C1 function as a rectifying/smoothing circuit for rectifying/smoothing a pulsed switch voltage Vsw brought out from the inductor connection terminal LX and generating the desired output voltage Vout. The above-described resistors R1, R2 function as a feedback voltage generation circuit (resistance voltage dividing circuit) for generating a feedback voltage Vfb that corresponds to the output voltage Vout. The above-described capacitor C2 is an element for regulating the soft start period. The resistor R3 and the capacitor C3 function as a phase compensation circuit that compensates for the output phase of an error amplifier 113, which will be described below. The above-described resistors R4, R5 function as an LDO feedback voltage generation circuit (resistance voltage dividing circuit) for generating an LDO feedback voltage Vadj that corresponds to an LDO output voltage Vldo.

Among the above-described discrete elements, the resistor Ra is a pull-up resistor for boosting the voltage Va appearing in the enable terminal ENA to a high level (substantially the level of the LDO output voltage Vldo) when an enable signal outputting transistor of the microcomputer 200 is turned off. However, the threshold voltage generation circuit 180 built into the semiconductor device 100 of the present embodiment is configured so that the resistor Ra is also used as a resistor for setting the overcurrent protection value (threshold voltage Vth). The operation of the threshold voltage generation circuit 180 is described in detail below.

The semiconductor device 100 is thus a DC/DC controller IC that forms a step-up switching regulator together with the external discrete elements.

The circuit block built into the semiconductor device 100 will be described in detail next.

The switch drive circuit 110 is a circuit block having an n-channel metal oxide semiconductor (MOS) field effect transistor 111, a controller 112, an error amplifier 113, a first reference voltage source 114, a switch 115, a resistor 116, and an overcurrent protection comparator 117 (referred to below as the "OCP comparator 117"); and the switch drive circuit performs drive control of the transistor 111 (output transistor) on the basis of the feedback voltage Vfb (divided voltage of the output voltage Vout) input via the feedback input terminal FB.

The transistor 111 is an output switching element (power transistor) connected between the inductor connection terminal LX and the ground end. Turning the transistor 111 on or off can generate the pulsed switch voltage Vsw in the inductor connection terminal LX. To describe the connective relationship in specific terms, the drain of the transistor 111 is connected to the inductor connection terminal LX. The source of the transistor 111 is connected to the ground end. The gate of the transistor 111 is connected to the gate signal output end of the controller 112.

The controller 112 generates the drive signal (gate voltage) of the transistor 111 on the basis of an error voltage Verr output from the error amplifier 113. Specifically, the controller 112 generates the drive signal of the transistor 111 so that the on-duty (the ratio showing the on-period of the transistor 111 as a proportion of a predetermined cycle) of the transistor 111 increases with the increased error voltage Verr, or, conversely, the on-duty of the transistor 111 decreases with the decreased error voltage Vern As will be described hereafter, the error voltage Verr increases the farther the output voltage Vout is from the target value thereof, and decreases the closer the output voltage Vout is to the target value thereof. In other words, the on-duty of the transistor 111 increases the farther the output voltage Vout is from the target value thereof, and decreases the closer the output voltage Vout is to the target value thereof. It is possible to match the output voltage Vout with the target value thereof using such on-duty control of the transistor 111.

The error amplifier 113 amplifies the differential between the feedback voltage Vfb and the lower of the predetermined first reference voltage Vref1 and the first soft-start voltage Vss1, generates the error voltage Verr, and outputs the error voltage Yen to the controller 112. To describe the connective relationship in specific terms, an inverting input end (−) of the error amplifier 113 is connected to the feedback terminal FB (the end impressed with the feedback voltage Vfb). A first non-inverting input end (+) of the error amplifier 113 is connected to the cathode end (the end impressed with the first reference voltage Vref1) of the first reference voltage source 114. The anode end of the first reference voltage source 114 is connected to the ground end. A second non-inverting input end (+) of the error amplifier 113 is connected to the soft-start adjustment terminal SS (the end impressed with the first soft-start voltage Vss1). Accordingly, the error voltage Yen increases the farther the feedback voltage Vfb is from the first reference voltage Vref1 (or the first soft-start voltage Vss1), and decreases the closer the feedback voltage Vfb is to the first reference voltage Vref1 (or the first soft-start voltage Vss1). In other words, the error voltage Verr increases the farther the output voltage Vout is from the target value thereof, and decreases the closer the output voltage Vout is to the target value thereof.

The switch 115, the resistor 116, and the OCP comparator 117 function as an overcurrent protection circuit 118 (referred to below as the "OCP circuit 118") for detecting whether the switch current Isw flowing in the transistor 111 (and, by extension, the inductor current IL flowing in the inductor L1) is in an overcurrent state, and thereby generating a logic-level overcurrent protection signal S1 that corresponds to the detection results, and outputting the signal to the controller 112 and the reset circuit 170. To describe the connective relationship in specific terms, one end of the switch 115 is connected to the inductor connection terminal LX. A non-inverting input end (+) of the OCP comparator 117 is connected to the other end of the switch 115, and is also connected to the ground end via the resistor 116. An inverting input end (−) of the OCP comparator 117 is connected to the output end of the threshold voltage generation circuit 180 (the end impressed with the threshold voltage Vth).

Figure 7:
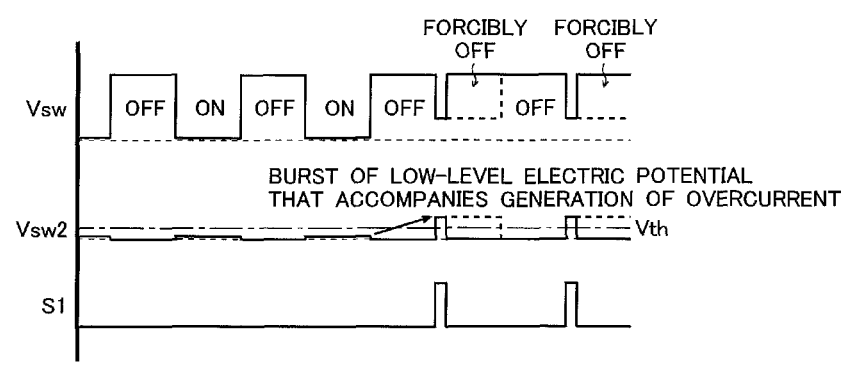
FIG. 7 is a timing chart showing one example of an overcurrent protection operation.

The operation of the OCP circuit 118 having the above-described configuration will be described in detail with reference to FIG. 7. FIG. 7 is a timing chart showing one example of the overcurrent protection operation, and shows, in order beginning at the top, the switch voltage Vsw, a second switch voltage Vsw2, and the overcurrent protection signal S1.

As has previously been described, the switch 115 is placed between the inductor connection terminal LX impressed with the switch voltage Vsw and the non-inverting input end (+) of the OCP comparator 117. Based on an on/off control signal from the controller 112, the switch 115 is turned to on when the transistor 111 is turned on, and is turned to off when the transistor 111 is turned off. The non-inverting input end (+) of the OCP comparator 117 is pulled down to the ground end via the resistor 116. The second switch voltage Vsw2 impressed on the non-inverting input end (+) of the OCP comparator 117 therefore matches the low-level electric potential of the switch voltage Vsw when the transistor 111 is on, and matches the ground potential GND when the transistor 111 is off, as shown in FIG. 7.

The low-level electric potential of the switch voltage Vsw obtained when the transistor 111 is on can be calculated using the integrated value (equal to Ron×Isw) of the on-resistance Ron of the transistor 111 and the switch current Isw flowing in the transistor 111. Therefore, the low-level electric potential of the switch voltage Vsw increases with the increasing switch current Isw, assuming that the on-resistance Ron of the transistor 111 remains constant.

It is therefore possible to detect whether the switch current Isw is in an overcurrent state by using the OCP comparator 117 to compare the second switch voltage Vsw2 and the predetermined threshold voltage Vth. In other words, in the semiconductor device 100 of the present embodiment, the overcurrent protection signal S1 reaches a low level (normal logic level) if the switch current Isw is smaller than a predetermined maximum current value and the second switch voltage Vsw2 is lower than the threshold voltage Vth, and, conversely, the overcurrent protection signal S1 reaches a high level (abnormal logic level) if the switch current Isw is larger than the predetermined maximum current value and the second switch voltage Vsw2 is higher than the threshold voltage Vth.

At the time the overcurrent protection signal S1 has risen to a high level (abnormal logic level), the controller 112 cancels an output feedback control that corresponds to the error voltage Verr and forcibly turns the transistor 111 off. A drive signal (gate voltage) of the transistor 111 is reset to a high level and the transistor 111 is turned on again by the controller 112 with every predetermined switching cycle because the overcurrent protection signal S1 again falls to a low level (normal logic level) when the switch current Isw is interrupted by such an overcurrent protection operation. However, if the overcurrent state of the switch current Isw is not resolved at this time, the same overcurrent protection operation described above is set in motion again, causing the transistor 111 to be turned off and the switch current Isw to be interrupted again.

In other words, in the semiconductor device 100 of the present embodiment, the transistor 111 is turned off without delay when the switch current Isw exceeds the predetermined maximum current value, and the on-duty of the transistor 111 is subsequently reduced and the peak value of the switch current Isw is lowered for every switching cycle of the transistor 111 unless the overcurrent state of the switch current Isw is resolved. The output voltage Vout also decreases simultaneously at this time. The above-described current-limiting characteristics are affected by the input voltage Vin, the switching cycle of the transistor 111, and the inductance value of the inductor L1.

Thus, with the OCP circuit 118 having the above-described configuration, it is possible to detect the overcurrent state of the switch current Isw without delay and to promptly set the overcurrent protection operation in motion. Therefore, damage to the semiconductor device 100 and peripheral components can be prevented, and the reliability of the set can be improved.

With the OCP circuit 118 having the above-described configuration, a sense resistor need not be introduced as overcurrent detection means into the current pathway of the switch current Isw or inductor current IL, allowing costs to be reduced and output efficiency to be improved.

The overcurrent detection means is not limited to the above-described embodiment and may also be configured to convert the switch current Isw or inductor current IL to a voltage signal by a sense resistor, and to compare the signal with a predetermined threshold voltage.

The overcurrent protection operation also is not limited to the method exemplified in the above-described embodiment (the so-called pulse-by-pulse reset method), and may also be a method for raising the overcurrent protection signal S1 to a high level (abnormal logic level), and subsequently forcibly maintaining the transistor 111 in the off state (the so-called off-latch method).

Returning to FIG. 6, the description of the circuit block built into the semiconductor device 100 will now be continued.

The soft start circuit 120 is a circuit block having an n-channel MOS field effect transistor 121, and a constant current source 122. The circuit generates a gradually increasing first soft-start voltage Vss1 and outputs the voltage to the error amplifier 113 by starting up the semiconductor device 100 and initiating the charging of the capacitor C2 connected to the soft-start adjustment terminal SS. To describe the connective relationship, the drain of the transistor 121 is connected to the soft-start adjustment terminal SS. The source of the transistor 121 is connected to the ground end. The gate of the transistor 121 is connected to a first reset signal output end (the end impressed with a first reset signal S7) of the reset circuit 170. One end of the constant current source 122 is connected to an internal power supply end. The other end of the constant current source 122 is connected to the soft-start adjustment terminal SS.

Figure 8:
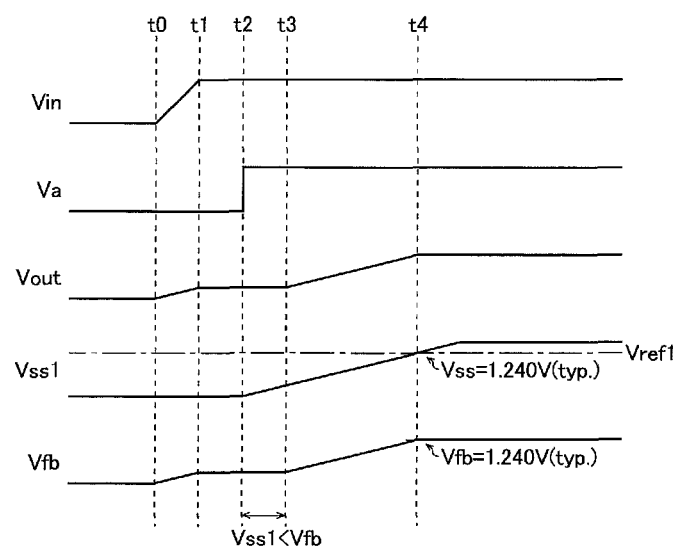
FIG. 8 is a timing chart showing one example of a soft start operation.
Figure 10:
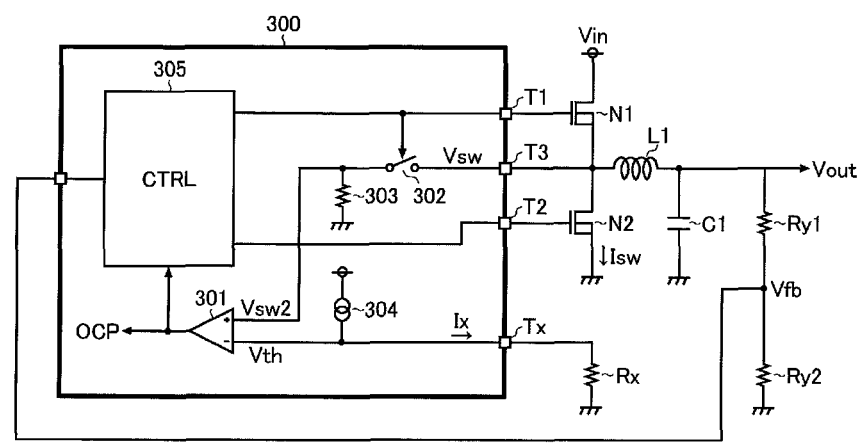
FIG. 10 is a circuit diagram showing a conventional example of an overcurrent protection circuit.

FIG. 8 is a timing chart showing one example of the soft start operation using the first soft-start voltage Vss1. The drawing depicts, in order from the top, the voltage waveforms of the input voltage Vin impressed on the power supply terminal VIN, the terminal voltage Va (enable signal Sa) impressed on the enable terminal ENA, the output voltage Vout impressed on the analog power supply terminal AVDD, the first soft-start voltage Vss1 impressed on the soft-start adjustment terminal SS, and the feedback voltage Vfb impressed on the feedback input terminal FB.

The input voltage Vin is input to the power supply terminal VIN at time t0, and the enable signal Sa (equal to terminal voltage Va) input to the enable terminal ENA rises from a low level (logic level when disabled) to a high level (logic level when enabled) at time t2 after the input voltage Yin has reached a predetermined value at time t1, whereupon the first reset signal S7 decreases to a low level, and the transistor 121 of the soft start circuit 120 is turned off. As a result, a charging current (for example, 4 µA) flows to the capacitor C2 from the constant current source 122, and the first soft-start voltage Vss1 appearing in the soft-start adjustment terminal SS begins to increase gradually from time t2 on.

During the interval (time t2 to t4) in which the first soft-start voltage Vss1 is lower than a predetermined first reference voltage Vref1 (for example, 1.24 V), the error voltage Verr is generated by the error amplifier 113 on the basis of the differential between the first soft-start voltage Vss1 and the feedback voltage Vfb (equal to Vout×(R2/(R1+R2))). In other words, output feedback control of the output voltage Vout is performed by the switch drive circuit 110 so as to match the first soft-start voltage Vss1 and the feedback voltage Vfb. Such a soft start operation allows the output voltage Vout to rise gradually while the charging current into the capacitor C1 is limited when the semiconductor device 100 is started up, making it possible to prevent overshooting of the output voltage Vout or rush currents from entering the load. The above-described soft start operation is then completed when the first soft-start voltage Vss1 reaches the first reference voltage Vref1 at time t4, and output feedback control of the output voltage Vout is subsequently performed by the switch drive circuit 110 so as to achieve a match between the first reference voltage Vref1 and the feedback voltage Vfb.

Returning to FIG. 6, the description of the circuit block built into the semiconductor device 100 will be continued.

The LDO regulator circuit 130 is a circuit block having an operational amplifier 131, a second reference voltage source 132, an n-channel MOS field effect transistor 133, a constant current source 134, and a capacitor 135. The circuit generates a predetermined LDO output voltage Vldo. To describe the connective relationship in specific terms, an inverting input end (−) of the operational amplifier 131 is connected to the LDO feedback input terminal ADJ (the end impressed with the LDO feedback voltage Vadj). A first non-inverting input end (+) of the operational amplifier 131 is connected to the cathode end of the second reference voltage source 132 (the end impressed with the second reference voltage Vref2). The anode end of the second reference voltage source 132 is connected to the ground end. A second non-inverting input end (+) of the operational amplifier 131 is connected to the drain of the transistor 133 (the end impressed with the second soft-start voltage Vss2). The output end of the operational amplifier 131 is connected to the LDO output terminal LDOO. The source of the transistor 133 is connected to the ground end. The gate of the transistor 133 is connected to a second reset signal output end (the end impressed with a second reset signal S8) of the reset circuit 170. One end of the constant current source 134 is connected to the internal power supply end. The other end of the constant current source 134 and one end of the capacitor 135 are each connected to the drain of the transistor 133. The other end of the capacitor 135 is connected to the ground end.

In the LDO regulator circuit 130 having the above-described configuration, the operational amplifier 131 performs output feedback control on the LDO output voltage Vldo so as to match the LDO feedback voltage Vadj and the lower of the second reference voltage Vref2 and the second soft-start voltage Vss2. The transistor 133, the constant current source 134, and the capacitor 135 function as a soft start circuit for generating the gradually increasing second soft-start voltage Vss2 and outputting the voltage to the operational amplifier 131 by starting up the semiconductor device 100 and initiating the charging of the capacitor 135. The operation of this soft start circuit is basically the same as the operation of the soft start circuit 120 described earlier, so a repeat of the description is omitted here.

The OVP circuit 140 is a circuit block for detecting whether the output voltage Vout input to the analog power supply terminal AVDD is in an overvoltage state, thereby generating a logic-level overvoltage protection signal S2 that corresponds to the detection results, and outputting the signal to the reset circuit 170. More specifically, the OVP circuit 140 sets the overvoltage protection signal S2 to a high level (normal logic level) if the output voltage Vout is lower than a predetermined maximum voltage value (for example, 15V), and sets the overvoltage protection signal S2 to a low level (abnormal logic level) if the output voltage Vout is higher than the predetermined maximum voltage value. The overvoltage protection operation based on the overvoltage protection signal S2 is described below together with the operation of the reset circuit 170.

The TOP circuit 150 is a circuit block for detecting whether the temperature being monitored (a junction temperature Tj of the semiconductor device 100) is in an elevated state, thereby generating a logic-level high-temperature protection signal S3 that corresponds to the detection results, and outputting the signal to the reset circuit 170. Specifically, the TOP circuit 150 sets the high-temperature protection signal S3 to a high level (normal logic level) if the junction temperature Tj is lower than a predetermined maximum temperature (for example, 150° C.), and sets the high-temperature protection signal S3 to a low level (abnormal logic level) if the junction temperature Tj is higher than the predetermined maximum temperature. The high-temperature protection operation based on the high-temperature protection signal S3 is described below together with the operation of the reset circuit 170.

The UVLO circuit 160 is a circuit block for detecting whether the input voltage Vin input to the power supply terminal VIN is in a low-voltage state, thereby generating a low-voltage protection signal S4 that corresponds to the detection results, and outputting the signal to the reset circuit 170. Specifically, the UVLO circuit 160 sets the low-voltage protection signal S4 to a high level (normal logic level) if the input voltage Vin is higher than a predetermined minimum voltage value (for example, 1.8 V), and sets the low-voltage protection signal S4 to a low level (abnormal logic level) if the input voltage Vin is lower than the predetermined minimum voltage. The low-voltage protection operation based on the low-voltage protection signal S4 is described below together with the operation of the reset circuit 170.

The reset circuit 170 is a circuit block having logical AND operators 171, 172, a negative AND operator 173, and an inverter 174. The circuit generates a first reset signal S7 output to the gate of the transistor 121, and a second reset signal S8 output to the gate of the transistor 133. To describe the connective relationship more specifically, a first input end of the logical AND operator 171 is connected to the output end (the end impressed with the high-temperature protection signal S3) of the TOP circuit 150. A second input end of the logical AND operator 171 is connected to the output end (the end impressed with the low-voltage protection signal S4) of the UVLO circuit 160. A first input end of the logical AND operator 172 is connected to the output end (the end impressed with a first operation signal S5) of the logical AND operator 171. A second input end of the logical AND operator 172 is connected to the enable terminal ENA. A first input end of the negative AND operator 173 is connected to the output end of the OCP circuit 118 (more accurately, the end impressed with an inverted overcurrent protection signal S1B resulting from logical inversion of the overcurrent protection signal S1). A second input end of the negative AND operator 173 is connected to the output end (the end impressed with the overvoltage protection signal S2) of the OVP circuit 140. A third input end of the negative AND operator 173 is connected to the output end (the end impressed with a second operation signal S6) of the logical AND operator 172. The output end of the negative AND operator 173 is connected to the gate of the transistor 121 as the output end for the first reset signal S7. The input end of the inverter 174 is connected to the output end (the end impressed with the first operation signal S5) of the logical AND operator 171. The output end of the inverter 174 is connected to the gate of the transistor 133 as the output end for the second reset signal S8.

In the reset circuit 170 having the configuration described above, the logical AND operator 171 sets the first operation signal S5 to a low level when at least one value among the high-temperature protection signal S3 and the low-voltage protection signal S4 is at a low level, and sets the first operation signal S5 to a high level when both the high-temperature protection signal S3 and the low-voltage protection signal S4 are at a high level. The logical AND operator 172 sets the second operation signal S6 to a low level when at least one value among the first operation signal S5 and the enable signal Sa is at a low level, and sets the second operation signal S6 to a high level when both the first operation signal S5 and the enable signal Sa are at a high level. The negative AND operator 173 sets the first reset signal S7 to a high level when at least one of any among the inverted overcurrent protection signal S1B, the overvoltage protection signal S2, and the second operation signal S6 is at a low level, and sets the first reset signal S7 to a low level when the inverted overcurrent protection signal S1B, the overvoltage protection signal S2, and the second operation signal S6 are all at a high level. The inverter 174 sets the second reset signal S8 to a high level when the first operation signal S5 is at a low level, and, conversely, sets the second reset signal S8 to a low level when the first operation signal S5 is at a high level. The transistor 121 is turned on, and the first soft-start voltage Vss1 is therefore discharged, when the first reset signal S7 has been set at a high level. The transistor 133 is turned on, and the second soft-start voltage Vss2 is therefore discharged, when the second reset signal S8 has been set at a high level.

FIG. 9 is a reference chart illustrating the reset operation in general terms. The chart shows the conditions for determining an abnormal state, the charge/discharge state of the capacitor C2 connected to the soft-start adjustment terminal SS, the operating state of the switch drive circuit 110 (step-up DC/DC converter), and the operating state of the LDO regulator circuit 130.

The first reset signal S7 reaches a high level when the enable signal Sa is set to a low level (logic level when disabled) and the voltage Va appearing in the enable terminal ENA decreases below a predetermined value (Vldo×0.3). Therefore, the transistor 121 is turned on, and the capacitor C2 is discharged. As a result, the switch drive circuit 110 is turned off (brought to a state in which the soft start operation has not been initiated). On the other hand, the second reset signal S8 reaches a low level without effect from the enable signal Sa as long as there is no high-temperature anomaly or low-voltage anomaly. Therefore, the transistor 133 is turned off and the capacitor 135 is charged. As a result, the LDO regulator circuit 130 is activated and the LDO output voltage Vldo is generated.

When the enable signal Sa is set to a high level (logic level when enabled), and the voltage Va appearing in the enable terminal ENA exceeds a predetermined value (Vldo×0.7), conditions that are free from other anomalies are established and the first reset signal S7 reaches a low level. Therefore, the transistor 121 is turned off and the capacitor C2 is charged. As a result, the switch drive circuit 110 is activated and the output voltage Vout is generated. As was described previously, the second reset signal S8 reaches a low level without effect from the enable signal Sa as long as no high-temperature anomaly or low-voltage anomaly is generated. Therefore, the transistor 133 is turned off and the capacitor 135 is charged. As a result, the LDO regulator circuit 130 is activated and the LDO output voltage Vldo is generated.

When the input voltage Vin input to the power supply terminal VIN falls below a predetermined minimum value (1.8 V), the low-voltage protection signal S3 reaches a low level, and the first reset signal S7 and the second reset signal S8 both reach a high level. Therefore, the transistor 121 and the transistor 133 both are turned on, and the capacitor C2 and the capacitor 135 both are discharged. As a result, the switch drive circuit 110 and the LDO regulator circuit 130 are both turned off. It should be noted that if the low-voltage state of the input voltage Vin is resolved, the semiconductor device 100 will be restarted.

When the junction temperature Tj of the semiconductor device 100 exceeds a predetermined maximum value (150° C.), the high-temperature protection signal S4 reaches a low level, and the first reset signal S7 and the second reset signal S8 both reach a high level. Therefore, the transistor 121 and the transistor 133 both are turned on, and the capacitor C2 and the capacitor 135 both are discharged. As a result, the switch drive circuit 110 and the LDO regulator circuit 130 are both turned off. It should be noted that if the power supply voltage Vin is input again, the semiconductor device 100 will be restarted.

When the output voltage Vout input to the analog power supply terminal AVDD exceeds a predetermined maximum value (15 V), the overvoltage protection signal S2 reaches a low level, and the first reset signal S7 reaches a high level. Therefore, the transistor 121 is turned on, and the capacitor C2 is discharged. As a result, the switch drive circuit 110 is turned off. On the other hand, the second reset signal S8 reaches a low level without effect from the overvoltage protection signal S2 as long as there is no high-temperature anomaly or low-voltage anomaly. Therefore, the transistor 133 is turned off and the capacitor 135 is charged. As a result, the LDO regulator circuit 130 is activated, and the LDO output voltage Vldo is generated. It should be noted that if the overvoltage state of the output voltage Vout is resolved, the semiconductor device 100 will be restarted.

When the switch current Isw (or the inductor current IL) flowing in the inductor connection terminal LX reaches an overcurrent state, the overcurrent protection signal S1 reaches a high level, and the first reset signal S7 reaches a high level. Therefore, the transistor 121 is turned on, and the capacitor C2 is discharged. As a result, the switch drive circuit 110 is turned off. On the other hand, the second reset signal S8 reaches a low level with no effect from the overcurrent protection signal S1 as long as there is no high-temperature anomaly or low-voltage anomaly. Therefore, the transistor 133 is turned off and the capacitor 135 is charged. As a result, the LDO regulator circuit 130 is activated, and the LDO output voltage Vldo is generated. It should be noted that if the overcurrent state of the switch current Isw (or the inductor current IL) is resolved, the semiconductor device 100 will be restarted.

Returning to FIG. 6, the description of the circuit block built into the semiconductor device 100 will now be continued.

The threshold voltage generation circuit 180 is a circuit block having a pnp bipolar transistor 181, a resistor 182 (resistance value Rb), an operational amplifier 183, and a third reference voltage source 184. The circuit block generates the threshold voltage Vth of the OCP comparator 117. To describe the connective relationship, the emitter of the transistor 181 is connected to the enable terminal ENA. The collector of the transistor 181 is connected to the ground end via the resistor 182, and is also connected to the inverting input end (−) of the OCP comparator 117 as the output end for the threshold voltage Vth. The base of the transistor 181 is connected to the output end of the operational amplifier 183. The inverting input end (−) of the operational amplifier 183 is connected to the enable terminal ENA. The non-inverting input end (+) of the operational amplifier 183 is connected to the anode end of the third reference voltage source 184. The cathode end of the third reference voltage source 184 is connected to the LDO output terminal LDOO.

The operation of the threshold voltage generation circuit 180 having the above-described configuration will be described next.

When the enable signal Sa input to the semiconductor device 100 from the microcomputer 200 is set to a high level (logic level when enabled), and drive is enabled for the semiconductor device 100, the operational amplifier 183 generates the base voltage of the transistor 181 so as to match the terminal voltage Va of the enable terminal ENA impressed on the inverting input end (−) of the operational amplifier, and the third reference voltage Vref3 (equal to a fixed voltage obtained by subtracting the electromotive voltage Vb of the third reference voltage source 184 from the LDO output voltage Vldo) impressed on the non-inverting input end (+) of the operational amplifier.

The electromotive voltage Vb of the third reference voltage source 184 is impressed between the enable terminal ENA and the LDO output terminal LDOO, i.e., between the two ends of the resistor Ra, through the above-described feedback control. A current Ia (equal to Vb/Ra) corresponding to the resistance value of the resistor Ra flows in the resistor Ra at this time.

The electromotive voltage Vb of the third reference voltage source 184 is set to an appropriately low voltage (for example, 0.1 V) that does not impair the logic level determination of the enable signal Sa in the logical AND operator 172.

The current Ia thus generated flows from the enable terminal ENA to the resistor 182 via the transistor 181. The enable signal outputting transistor of the microcomputer 200 is turned off when the enable signal output end of the microcomputer 200 is set to the open-drain mode (or open-collector mode) and the enable signal Sa is set to a high level. Therefore, no current flows from the LDO output terminal LDOO to the microcomputer 200 via the resistor Ra, nor does a current flow from the microcomputer 200 into the enable terminal ENA. The inverting input end (−) of the operational amplifier 183 and the second input end of the negative AND operator 173 are both set to a high impedance, and no current flows from the enable terminal ENA to the negative AND operator 173. Therefore, all of the current Ia flowing in the resistor Ra flows to the resistor 182. As a result, a voltage signal (equal to Vb/Ra×Rb) corresponding to the current value of the current Ia and to the resistance value of the resistor 182 is brought out from one end of the resistor 182, and the voltage signal is output as the threshold voltage Vth.

Here, the electromotive voltage Vb of the third reference voltage source 184 and the resistance value Rb of the resistor 182, as two parameters from among the above-described parameters that determine the voltage value of the threshold voltage Vth, are both fixed values set in advance when the semiconductor device 100 is manufactured. The voltage value of the threshold voltage Vth is therefore variably controlled in accordance with the resistance value of the resistor Ra.

As described above, the threshold voltage generation circuit 180 of the present embodiment is integrated in the semiconductor device 100 provided with the LDO output terminal LDOO impressed with the fixed LDO output voltage Vldo, and also provided with the enable terminal ENA connected to the LDO output terminal LDOO via the external resistor Ra; and is configured to create a flow of the current Ia in the resistor Ra and to set the threshold voltage Vth, which is an internal parameter of the semiconductor device 100, in accordance with the current Ia by impressing the predetermined voltage Vb between the LDO output terminal LDOO and the enable terminal ENA.

With such a configuration, the operation setting terminal (logic terminal) and the internal parameter setting terminal (analog terminal) of the semiconductor device 100 can be combined into one terminal. Therefore, the voltage value of the threshold voltage Vth can be arbitrarily set without unnecessarily increasing the number of external terminals for the semiconductor device 100, and the size and cost of the package can therefore be reduced.

When the enable signal Sa input to the semiconductor device 100 from the microcomputer 200 is set to a low level (logic level when disabled), and driving of the semiconductor device 100 is prohibited, the desired threshold voltage Vth cannot be generated by the threshold voltage generation circuit 180, although this does not interrupt the operation in any particular way since the OCP circuit 118 itself is inherently in a state in which driving is prohibited.

The above embodiment was described with reference to an example of a configuration in which a parameter setting circuit according to the present invention is used as a threshold voltage generation circuit for arbitrarily setting the overcurrent protection value (threshold voltage Vth) of an overcurrent protection circuit, the threshold voltage generation circuit being built into the DC/DC controller IC that forms a step-up switching regulator. However, the intended applications of the present invention are not limited to this configuration alone, and the present invention may also be suitably applied to a parameter setting circuit used for other applications. The present invention can be broadly applied to step-down switching regulators, step-up switching regulators, and other various power supply devices.

The above embodiment was described with reference to an example of a configuration in which the resistor Ra for pulling up the enable terminal ENA to the LDO output terminal LDOO was used as a resistor for setting the threshold voltage Vth, but the configuration of the present invention is not limited to this option alone, and the enable terminal ENA may instead be pulled up, for example, to the power supply terminal VIN via the resistor Ra. In brief, as long as feedback control to a predetermined fixed value can be performed within the semiconductor device 100 on the voltage between both ends of the resistor Ra, it is of no consequence to which terminal the enable terminal ENA is pulled up via the resistor Ra.

The above embodiment was described with reference to examples including a configuration in which the pull-up resistor Ra connected to the enable terminal ENA was used as the resistor for setting the threshold voltage Vth, but the present invention is not limited to this option alone, and it is also possible to use a pull-up resistor or pull-down resistor that is connected to a mode setting pin, a frequency switching pin, or another input terminal, output terminal, or input/output terminal for a logic signal, rather than the enable terminal ENA. The logic level of the logic signal must be fixed either at a high level or at a low level in a state in which the OCP circuit 118 must be placed into drive, i.e., in the drive-enabled state of the semiconductor device 100.

The MOS field effect transistors and bipolar transistors may also be optionally interchanged. When such interchange is performed, the transistors may be connected so that the emitter is substituted for the source, the collector for the drain, and the base for the gate.

<Combination of First and Second Technical Features>

Figure 11:
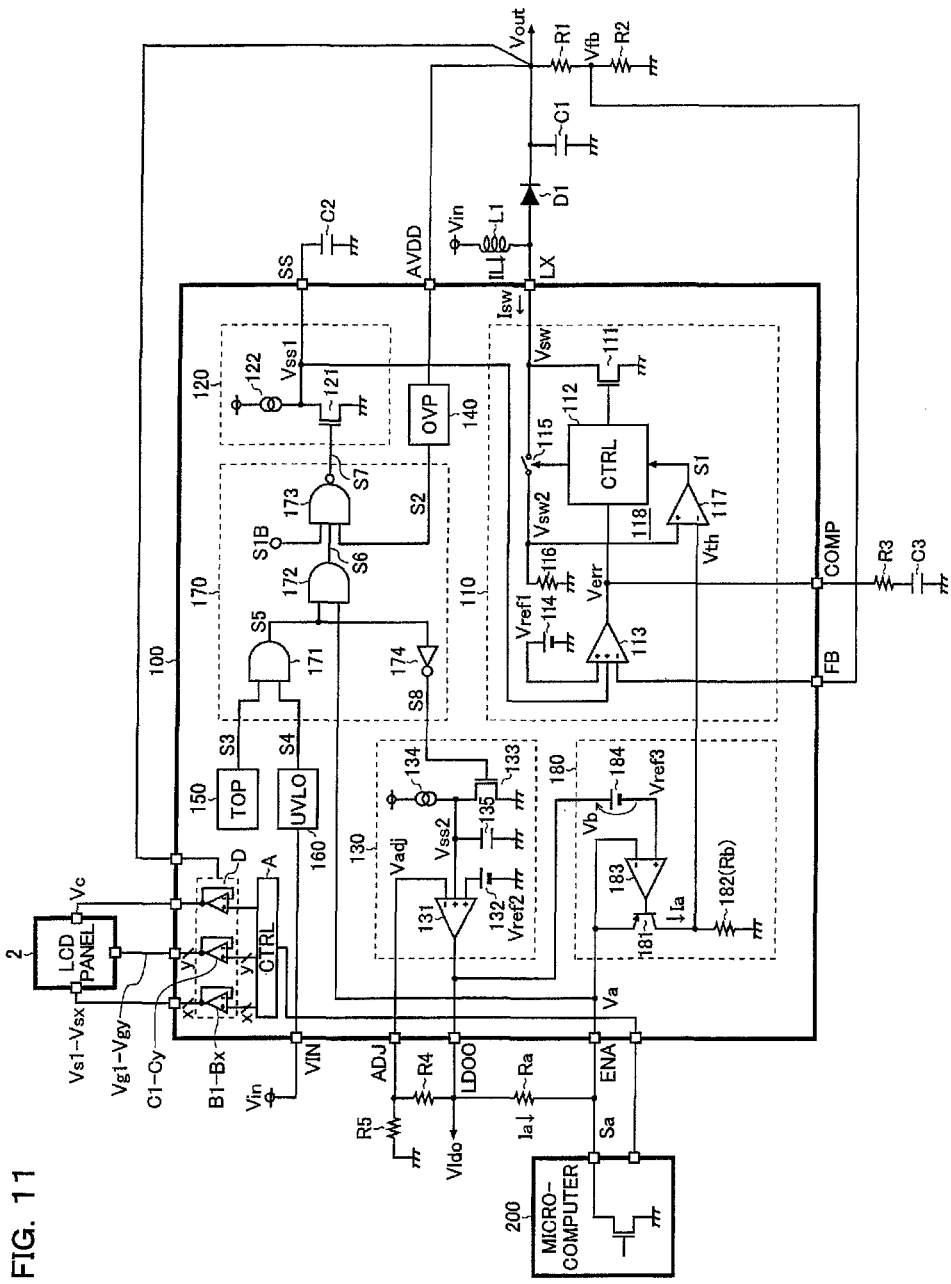
FIG. 11 is a circuit diagram showing a configurational example of a liquid crystal drive device having a combination of the first and second technical features.

FIG. 11 is a circuit diagram showing a configurational example of a liquid crystal drive device having a combination of the above-described first and second technical features. The liquid crystal drive device of the present configurational example is configured so that the logic circuit A (drive control circuit of the liquid crystal panel 2), the unit gain amplifiers B1 to Bx, the unit gain amplifiers C1 to Cy, and the unit gain amplifier D shown in FIG. 4 are combined within the semiconductor device 100 shown in FIG. 6.

The logic circuit A performs the panel control (tone control in response to a video signal, logical inversion control with each frame and each dot, and the like) of the source voltages Vs1 to Vsx, the gate voltages Vg0 to Vgy, and the common voltage Vc on the basis of a video signal input from the microcomputer 200.

The unit gain amplifiers B1 to Bx are supplied with and driven by the output voltage Vout, are correspondingly provided in the x-system source signal paths connected to the liquid crystal display panel 2, and output the source voltages Vs1 to Vsx that correspond to the input signals from the logic circuit A.

The unit gain amplifiers C1 to Cy are supplied with and driven by the output voltage Vout, are correspondingly provided in the y-system gate signal paths connected to the liquid crystal display panel 2, and output the gate voltages Vg1 to Vgy that correspond to the input signals from the logic circuit A.

The unit gain amplifier D is supplied with and driven by the output voltage Vout, is provided in the single-system common signal path connected to the liquid crystal display panel 2, and outputs the common voltage Vc that corresponds to an input signal from the logic circuit A.

The operational amplifier shown in FIGS. 1 to 3 can be suitably used for the unit gain amplifiers B1 to Bx, unit gain amplifiers C1 to Cy, and unit gain amplifier D.

With the liquid crystal drive device of the present configurational example, the operation/effect due to the first technical feature (increased slew rate) and the operation/effect due to the second technical feature (reduced number of external terminals) can be advantageously combined, allowing a liquid crystal drive device having high commercial value to be provided.

OTHER MODIFIED EXAMPLES

In addition to the above-described embodiments, various modifications of the configuration of the present invention are possible without departing from the main intent of the invention. Specifically, the above-described embodiments illustrate the overall concept, and should not be construed as imitative. It should be understood that the technical scope of the present invention is disclosed by the scope of the claims rather than by the description of the above embodiments, and that all modifications equivalent to the scope of the claims and belonging to the claims are incorporated therein.

FIRST INDUSTRIAL APPLICABILITY

The present invention is a valuable technique in terms of increasing the slew rate of general-purpose operational amplifiers for broad general use in, for example, liquid crystal displays, plasma displays, power sources for laptop computers (power sources for double-data-rate (DDR) memories, and the like), digital versatile disc (DVD) players/recorders, and blu-ray disc (BD) players/recorders.

SECOND INDUSTRIAL APPLICABILITY

The present invention is a valuable technique in terms of reducing the size of power supply units mounted in, for example, liquid crystal displays, plasma displays, power sources for laptop computers (power sources for double-data-rate (DDR) memories, and the like), digital versatile disc (DVD) players/recorders, and blu-ray disc (BD) players/recorders.

LIST OF REFERENCE NUMERALS

10 First differential input part (p-channel)
11, 12: P-channel MOS field effect transistor
13, 14: N-channel MOS field effect transistor
20: Second differential input part (n-channel)
21, 22: N-channel MOS field effect transistor
23, 24: P-channel MOS field effect transistor
30: Output part
31: P-channel MOS field effect transistor
32: N-channel MOS field effect transistor
33, 34: Resistor
35, 36: Capacitor
40: First auxiliary current generator
41: P-channel MOS field effect transistor
42: Resistor
43: Capacitor
44, 45: N-channel MOS field effect transistor
50: Second auxiliary current generator
51: N-channel MOS field effect transistor
52: Resistor
53: Capacitor
54, 55: P-channel MOS field effect transistor
60: Drive current generator
61, 62, 63: P-channel MOS field effect transistor
64, 65: N-channel MOS field effect transistor
1: Liquid crystal drive device
2: Liquid crystal display panel
A: Logic circuit
B0 to Bx: Unit gain amplifier (operational amplifier)
C0 to Cy: Unit gain amplifier (operational amplifier)
D: Unit gain amplifier (operational amplifier)
100: Semiconductor device (DC/DC Controller IC)
110: Switch drive circuit
111: N-channel MOS field effect transistor (output transistor)
112: Controller
113: Error amplifier
114: First reference voltage source
115: Switch
116: Resistor
117: Overcurrent protection comparator (OCP comparator)
118: Overcurrent protection comparator (OCP circuit)
120: Soft start circuit
121: N-channel MOS field effect transistor
122: Constant current source
130: LDO regulator
131: Operational amplifier
132: Second reference voltage source
133: N-channel MOS field effect transistor
134: Constant current source
135: Capacitor
140: Overvoltage protection circuit (OVP circuit)
150: Thermal overload protection circuit (TOP circuit)
160: Under-voltage lock-out circuit (UVLO circuit)
170: Reset circuit
171, 172: Logical AND operator
173: Negative AND operator
174: Inverter
180: Threshold voltage generation circuit (parameter setting circuit)
181: Pnp bipolar transistor
182: Resistor
183: Operational amplifier
184: Third reference voltage source
200: Microcomputer
L1: Inductor
D1: Diode
C1 to C3: Capacitor
R1 to R5: Resistor
Ra: Resistor (for pulling up/setting protecting values)
VIN: Power supply terminal
ADJ: LDO feedback input terminal
LDOO: LDO output terminal
ENA: Enable terminal
FB: Feedback input terminal
COMP: Phase compensation terminal
LX: Inductor connection terminal
AVDD: Analog power supply terminal
SS: Soft-start adjustment terminal

What is claimed is:

1. An operational amplifier comprising:
at least one differential input part for generating a voltage signal corresponding to an electric potential difference between a positive-phase input signal and a negative-phase input signal by using a differential pair configured from a pair of transistors;
an output part for generating and outputting an output signal of a logic level corresponding to the voltage signal generated by the differential input part;
at least one auxiliary current generator for detecting a sudden change in the positive-phase input signal or the negative-phase input signal and generating an auxiliary current; and
a drive current generator for adding together a predetermined reference current and the auxiliary current and generating a drive current of the differential input part, wherein the auxiliary current generator comprises:
a differentiating circuit for receiving an input of a voltage that appears in a common connection end of the differential pair, and generating a differential waveform signal thereof; and
a switch for controlling generation or non-generation of the auxiliary current in accordance with the differential waveform signal.

2. The operational amplifier of claim 1, wherein the differentiating circuit is a CR filter having a resistor and a capacitor.

3. The operational amplifier of claim 1, wherein the differential input part comprises:
a first differential input part having a first differential pair comprising a pair of p-channel MOS field effect transistors; and
a second differential input part having a second differential pair comprising a pair of n-channel MOS field effect transistors.

4. The operational amplifier of claim 3, wherein the auxiliary current generator comprises:
a first auxiliary current generator for monitoring a first voltage that appears in a common connection end of the first differential pair, detecting a fall from a high level to a low level in the positive-phase input signal, and generating a first auxiliary current; and
a second auxiliary current generator for monitoring a second voltage that appears in a common connection end of the second differential pair, detecting a rise from a low level to a high level in the positive-phase input signal, and generating a second auxiliary current.

5. A parameter setting circuit integrated in a semiconductor device and comprising:
a first external terminal impressed with a fixed voltage, and a second external terminal connected to the first external terminal via an external resistor;
passing a current through the external resistor by impressing a predetermined reference voltage between the first external terminal and the second external terminal, and setting an internal parameter for the semiconductor device in accordance with the current,
a transistor having one end connected to the second external terminal;
a resistor having one end connected to another end of the transistor; and
an operational amplifier having a first input end connected to the first external terminal via a voltage source for generating the reference voltage, having a second input end connected to the second external terminal, and having an output end connected to a control end of the transistor;
wherein the parameter setting circuit outputs a voltage signal brought out from one end of the resistor as the internal parameter.

6. The parameter setting circuit of claim 5, wherein the second external terminal is an input terminal, an output terminal, or an input/output terminal for a logic signal.

7. The parameter setting circuit of claim 6, wherein the logic signal is an enable signal for controlling operation or non-operation of the semiconductor device.

8. A liquid crystal drive device comprising:
a unit gain amplifier provided in a signal path to a liquid crystal display panel; and
a power supply circuit for generating a desired output voltage from an input voltage and supplying electrical power to the unit gain amplifier;
wherein the unit gain amplifier comprises:
at least one differential input part for generating a voltage signal corresponding to an electric potential difference between a positive-phase input signal and a negative-phase input signal by using a differential pair configured from a pair of transistors;
an output part for generating and outputting an output signal of a logic level corresponding to the voltage signal generated by the differential input part;
at least one auxiliary current generator for detecting a sudden change in the positive-phase input signal or the negative-phase input signal and generating an auxiliary current; and
a drive current generator for adding together a predetermined reference current and the auxiliary current and generating a drive current of the differential input part;
wherein the semiconductor device comprises:
a first external terminal impressed with a fixed voltage; and
a second external terminal connected to the first external terminal via an external resistor;
wherein the power supply circuit comprises:
an overcurrent protection circuit for generating an overcurrent protection signal showing whether a monitored current is in an overcurrent state; and
an overcurrent protection value setting circuit for passing a current through the external resistor by impressing a predetermined reference voltage between the first external terminal and the second external terminal, and setting an overcurrent protection value for the overcurrent protection circuit in accordance with the current, and wherein the auxiliary current generator comprises:
a differentiating circuit for receiving an input of a voltage that appears in a common connection end of the differential pair and generating a differential waveform signal thereof; and
a switch for controlling generation or non-generation of the auxiliary current in accordance with the differential waveform signal.

9. The liquid crystal drive device of claim 8, wherein the differential circuit is a CR filter having a resistor and a capacitor.

10. The liquid crystal drive device of claim 8, wherein the differential input part comprises:
a first differential input part having a first differential pair configured from a pair of p-channel MOS field effect transistors; and
a second differential input part having a second differential pair configured from a pair of n-channel MOS field effect transistors.

11. The liquid crystal drive device of claim 10, wherein the auxiliary current generator comprises:

a first auxiliary current generator for monitoring a first voltage that appears in a common connection end of the first differential pair, detecting a fall from a high level to a low level in the positive-phase input signal, and generating a first auxiliary current; and a second auxiliary current generator for monitoring a second voltage that appears in a common connection end of the second differential pair, detecting a rise from a low level to a high level in the positive-phase input signal, and generating a second auxiliary current.

12. The liquid crystal drive device of claim 10, wherein the overcurrent protection value setting circuit comprises:

a transistor having one end connected to the second external terminal;

a resistor having one end connected to another end of the transistor; and an operational amplifier having a first input end connected to the first external terminal via a voltage source for generating the reference voltage, having a second input end connected to the second external terminal, and having an output end connected to a control end of the transistor;

wherein the overcurrent protection value setting circuit outputs a voltage signal brought out from one end of the resistor as the overcurrent protection value.

13. The liquid crystal drive device of claim 8, wherein the second external terminal is an input terminal, output terminal, or input/output terminal of a logic signal.

14. The liquid crystal drive device of claim 13, wherein the logic signal is an enable signal for controlling operation or non-operation of the semiconductor device.

15. The liquid crystal drive device of claim 8, wherein the power supply circuit has a switch drive circuit provided with a shut-down function based on the overcurrent protection signal.

16. The liquid crystal drive device of claim 15, comprising a switching element subjected to on/off control by the switch drive circuit.

\* \* \* \* \*